(12) United States Patent
Sakurai et al.

(10) Patent No.: US 6,282,136 B1
(45) Date of Patent: Aug. 28, 2001

(54) SEMICONDUCTOR MEMORY DEVICES AND SENSORS USING THE SAME

(75) Inventors: Kohei Sakurai, Hitachi; Tatsumi Yamauchi, Hitachiota; Masahiro Matsumoto, Hitachi; Fumio Murabayashi, Urizura; Hiromichi Yamada, Hitachi; Atsushi Miyazaki; Keiji Hanzawa, both of Mito, all of (JP)

(73) Assignees: Hitachi, Ltd., Tokyo; Hitachi Car Engineering Co., Ltd., Hitachinaka, both of (JP)

( * ) Notice: Subject to any disclaimer, the term of this patent is extended or adjusted under 35 U.S.C. 154(b) by 0 days.

(21) Appl. No.: 09/578,854

(22) Filed: May 26, 2000

(30) Foreign Application Priority Data

May 31, 1999 (JP) ................................................. 11-151122

(51) Int. Cl.[7] ..................................................... G11C 7/00
(52) U.S. Cl. ...................... 365/203; 365/104; 365/189.01
(58) Field of Search .................................... 365/104, 203, 365/204, 230.03, 189.01

(56) References Cited

U.S. PATENT DOCUMENTS

| 5,740,108 | * | 4/1998 | Okubo ............................. 365/185.17 |
| 5,745,401 | * | 4/1998 | Lee ...................................... 365/104 |
| 5,757,709 | * | 5/1998 | Suminaga et al. ................... 365/104 |
| 5,914,903 | * | 6/1999 | Kanma et al. ........................ 365/203 |

FOREIGN PATENT DOCUMENTS

| 6-119793 | 4/1994 | (JP) . |
| 9-113310 | 5/1997 | (JP) . |
| 10-281912 | 10/1998 | (JP) . |

* cited by examiner

Primary Examiner—Son Mai
(74) Attorney, Agent, or Firm—Crowell & Moring, L.L.P.

(57) ABSTRACT

In a semiconductor memory device, the drain of a transistor for pre-charging is connected to a data line via the Y switch. Lower level bit signals are input into an X decoder for selecting the word line in a memory cell array; and higher level bit signals are input into a Y decoder for selecting the Y switch control signal lines. The addresses in the memory cell array are arranged sequentially in the direction of the data lines.

5 Claims, 11 Drawing Sheets

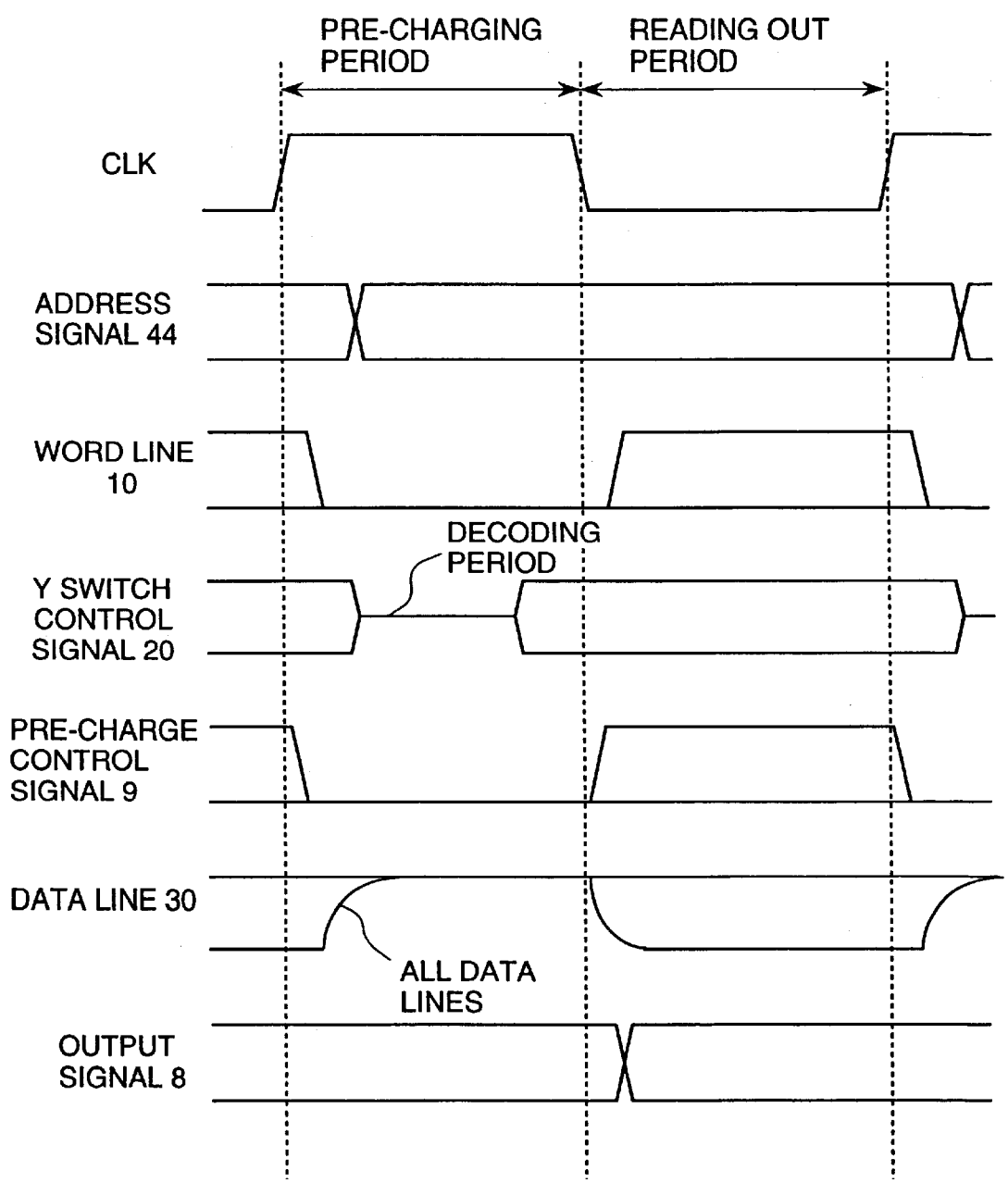

SEMICONDUCTOR MEMORY DEVICES AND SENSORS USING THE SAME

BACKGROUND OF THE INVENTION

The present invention relates to semiconductor memory devices and sensors using same, in particular, to ROM and RAM of low consuming power and pressure sensors using same.

Currently, integrated circuits for microcomputers and the like, which perform various processing, tend to increase velocity and scale, and have an issue to reduce the consuming current simultaneously with achieving the current tendencies. Accordingly, decreasing its consuming current is required for the semiconductor memory device, which is incorporated with chips such as ROM or RAM. Hereinafter, a conventional example is explained taking ROM as an example of semiconductor device.

FIG. 10 indicates a composition of representative example of ROM using conventional pre-charge system.

The ROM is a semiconductor memory device for storing non-volatile data such as control programs, processing programs, and the like. In accordance with the ROM explained hereinafter, the memory portion is regarded to be composed of memory capacity n×m bits, that is, the memory portion is composed of a matrix having n lines of word line, and m lines of data line.

The ROM indicated in FIG. 10 is composed of: memory cell array 5 composed of memory cells 50, wherein data are stored in a non-volatile manner; X decoder, which selects a word line from n word lines 10 in the memory cell array corresponding to an address signal transmitted from address latch 4 to the ROM; m pieces of transistors 90 for pre-charging m data lines 30; output circuit 7 for reading out the data in the data lines; Y switch 6 composed of m bus-transistors for connecting the output circuit and the data lines; and Y decoder 2, which selects a line from m Y switch control signal lines corresponding to address signal transmitted from the address latch to the ROM.

Circuit operation of the semiconductor memory device indicated in FIG. 10 is explained referring to timing chart in FIG. 11 indicating potential variation in clock and respective signal lines.

When the clock (CLK) is changed from low level (hereinafter, called as L) to high level (hereinafter, called as H), that is, on the rising edge of the clock, the address signal 44 is transmitted to the X decoder 1 and the Y decoder 2 from the address latch 4, and decoding is started. Decoding the address is completed during the period while the clock is in H, and one of m lines of Y switch control signal lines is selected and changed to H.

Similarly, in accordance with rising of the clock, the pre-charge control signal 9 is changed to L, and the transistors 90 for pre-charging are changed to on. Accordingly, m data lines 30 are pre-charged to power source voltage $V_{DD}$, that is, to H. During the period while the clock is in H, a signal reverse to the clock, that is, L is input to the X decoder 1. Therefore, any of the word lines does not become H, and the electric charge, which is pre-charged to the data lines, is not withdrawn.

Then, when the clock becomes L, one of the n word lines is selected, and becomes H. At this time, if the memory cell, wherein N channel transistor is formed, is selected, the electric charge of the data line is withdrawn and the data line becomes L, and output signals 8 are output via the output circuit 7. On the other hand, if the memory cell, wherein N channel transistor is not formed, is selected, the electric charge of the data line is not withdrawn and the data line maintains H, and output signals 8 are output via the output circuit 7. As explained above, respective of the memory cells 50 of the memory array 5 is programmed by data "1" or "0" during manufacturing process depending on the presence or non-presence of the N channel transistor.

As explained above, in accordance with the pre-charged type ROM, it is indispensable to complete two operations such as "decoding the address" and "pre-charging the data lines" during the clock is in H.

In addition to the above prior art, an example of prior art of semiconductor memory device using improved bit line pre-charging method is disclosed, for instance, in JP-6-119793 (1994)

Prior art, wherein ROM or RAM is used as a part of correcting means for pressure sensor, are disclosed in JP-A-9-113310 (1997), JP-A-10-281912 (1998), but practical circuit composition of these semiconductor memory devices are not described.

Because the conventional semiconductor memory device indicated in FIG. 10 is composed as described above, all the m lines of the data lines are pre-charged during the clock is in H irrelevant to the actually selected address. This is because, as indicated in the timing chart in FIG. 11, the pre-charging and decoding are performed simultaneously in the period when the clock is in H, a data line corresponding to the address can not be selected during the period, and all the data lines must be pre-charged.

As explained above, one of the word lines becomes H during the clock is in L. Therefore, even with the non-selected data lines, in a case when N channel transistor is formed in the memory cell at a crossing point of the above data line and the word line in H, the withdrawn of the electric charge is occurred. The data line must be pre-charged again in the next cycle. As explained above, in accordance with the conventional circuit composition to pre-charge all the data lines, useless consuming current is increased, and as a consequence, a problem to increase consuming current at the memory cell array is occurred.

In order to solve the above problem, for instance, JP-A-6-119792 (1994) discloses a data line selection pre-charging method, wherein only a selected address data line is pre-charged.

The above method utilizes a principle that, because decoding address is completed at relatively first half of the period during the clock is H, the selected data line can be pre-charged after finishing the above operation, that is, decoding and pre-charging can be performed serially during the period when the clock is in H. Accordingly, the data line at the selected address can be pre-charged by composing the circuit in a manner that the drain of the transistor for pre-charging is connected to the data line of the memory cell array via a Y switch. In accordance with this method, significant decrease of the consuming current at the pre-charging can be realized in comparison with the prior art, wherein all the data lines are pre-charged.

However, in accordance with the circuit system disclosed in JP-A-6-119793 (1994), there is a possibility that the transistor for pre-charging becomes on before finishing the decoding, because decoding the address and pre-charging the data line are performed simultaneously from starting-up of the clock. Therefore, practically, a problem is generated that data line of an address which is not selected in the cycle is pre-charged during a period between the time when the transistor for pre-charging becomes on to the time when decoding is finished completely, that is, a period until only a selected path transistor becomes on. In particular, in accordance with the circuit system disclosed in JP-A-6-119793 (1994), because the address of the memory cell are arranged along the word line, the path transistor connected to different data line must be switched on per every cycle even when accessing continuous addresses. Therefore, in accordance with the above reason, the data line at the address selected in the prior cycle is pre-charged again. The output of not only X decoder, but also Y decoder are varied per every cycles, and the consuming current of the decoders is also increased.

SUMMARY OF THE INVENTION

The present invention is achieved in consideration of the above circumstances. One of the main objects of the present invention is to provide a semiconductor memory device, which is capable of decreasing the consuming current at the pre-charging to 1/m (m is the number of data lines), and simultaneously decreasing the consuming current of the decoders, by pre-charging only a data line at the address selected in the cycle.

The other object of the present invention is to realize a sensor of low consuming current by applying the semiconductor memory device of the low consuming current as described above to the sensor having a correcting means for correcting characteristics respectively.

The present invention is achieved in order to solve the above problems. A semiconductor memory device comprising plural memory cells for storing information; plural word line s and data lines; an output circuit for outputting stored data; a first decoder selecting one of the word lines corresponding to address signal; plural path transistors for connecting the data lines with the output circuit; a second decoder for selecting one of the path transistors corresponding to address signal and switching the chosen path transistor on; and transistor for pre-charging the data lines prior to read out the data; is characterized in arranging addresses of the memory cells array sequentially in a direction of data lines by inputting lower level bit signals of the address into the first decoder, and inputting higher level bit signals of the address into the second decoder.

The other feature of the present invention is that, in accordance with the semiconductor memory device wherein the address to be accessed is varied continuously, the lower level bit signals of the address are input into the first decoder, and the higher level bit signals of the address are input into the second decoder.

The above problem can be solved by controlling the timing of making the transistor for pre-charging on using a delaying means.

The present invention is characterized in connecting the drain of the transistor for pre-charging to the data lines via the path transistor .

Furthermore, a sensor of low consuming current can be realized by applying the semiconductor memory device having the composition as described previously to the sensor having a correcting means respectively for correcting its characteristics.

BRIEF DESCRIPTION OF THE DRAWINGS

These and other objects, features and advantages of the present invention will be understood more clearly from the following detailed description with reference to the accompanying drawings, wherein, FIG. 11 is a timing chart for explaining the circuit operation of the prior art.

DETAILED DESCRIPTION OF THE PREFERRED EMBODIMENTS

Figure 1:
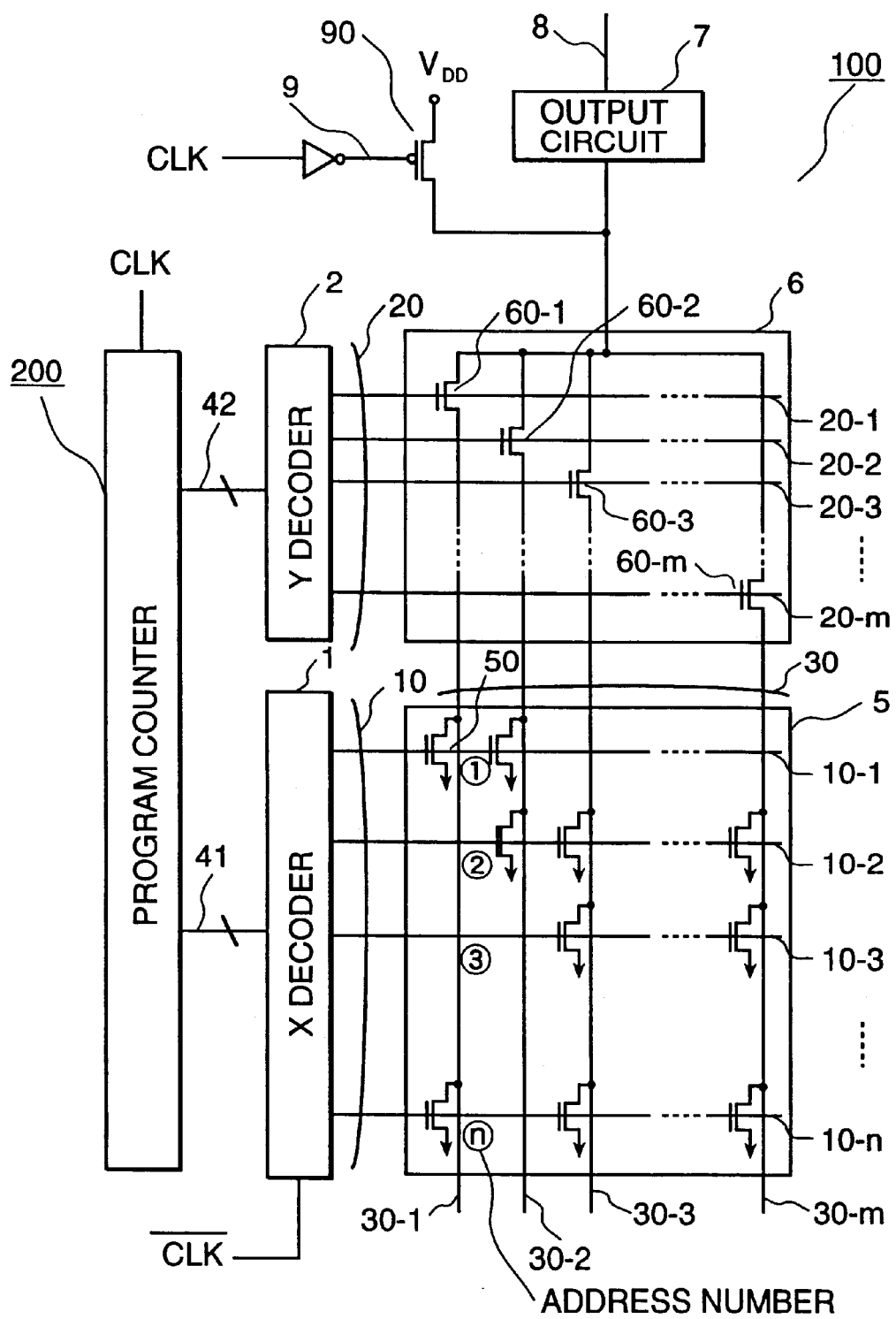
FIG. 1 is a schematic illustration for explaining the first embodiment of the present invention.

Hereinafter, details of the semiconductor memory device and the sensor using the same of the present invention are explained in details referring to the drawings.

FIG. 1 indicates the first embodiment relating to a semiconductor memory device of the present invention. The embodiment relates to the semiconductor memory device, wherein address signals are input from a program counter, which transmits the address signals only to the semiconductor memory device; and lower level bit signals of the address are input into an X decoder, and higher level bit signals are input into an Y decoder.

The embodiment indicated in FIG. 1 is described particularly on a ROM, but if flip-flop is used for memory cell, it can be applied to a RAM. Hereinafter, the ROM of pre-charging system is explained, and its memory portion is composed of a memory of capacity n×m bits, that is, a matrix of n rows by m columns of n word lines and m data lines.

The ROM 100 indicated in FIG. 1 is connected to the program counter 200, which transmits address signals only to the ROM 100, and is composed of the memory cell array 5 for storing data; the X decoder 1, which selects a line out of n word lines 10 of the memory cell array corresponding to the address signals 41 transmitted from the program counter 200 to the ROM 100; the transistor 90 for pre-charging the data line 30; the output circuit 7 for reading out the data from the data line; the Y switch 6 composed of m pieces of path transistors 60 for connecting the output circuit and the data lines; and the Y decoder 2, which selects a line out of m Y switch control signal lines 20 corresponding to the address signals 42 transmitted from the program counter 200 to the ROM 100.

Different from conventional microcomputers, a circuit for initial setting at switching on the power source and a reset circuit as a countermeasure for runaway become unnecessary by composing the program counter so that address signals are transmitted only to the ROM, because the program counter does not designate any executive address of hard modules other than the ROM such as resister, RAM, and others, and always designates a program for executing any processing.

The drain of the transistor 90 for pre-charging is connected to the data line 30 of the memory cell array via the Y switch 6. Therefore, the data line at the selected address can be pre-charged by making only the selected path transistor in the Y decoder 2 on, and significant decrease of consuming current at pre-charging can be realized in comparison with the conventional method, wherein all the data lines are pre-charged. Moreover, the number of transistors for pre-charging can be decreased to 1/m (m is the number of data lines).

Further important feature of the present invention is in inputting low level bit signals of the address 41 into the X decoder 1, and upper level bit signals 42 of the address into the Y decoder 2. Accordingly, different from JP-A-6-119793 (1994), the address of the memory cell array 5 can be arranged in order from ① in a direction of the data line as indicated in FIG. 1. The circuit system as described above is invented by utilizing such features that the program has localization in general, and the address of the ROM is frequently accessed successively, for instance such as ①→②→③. . . .

Figure 2:
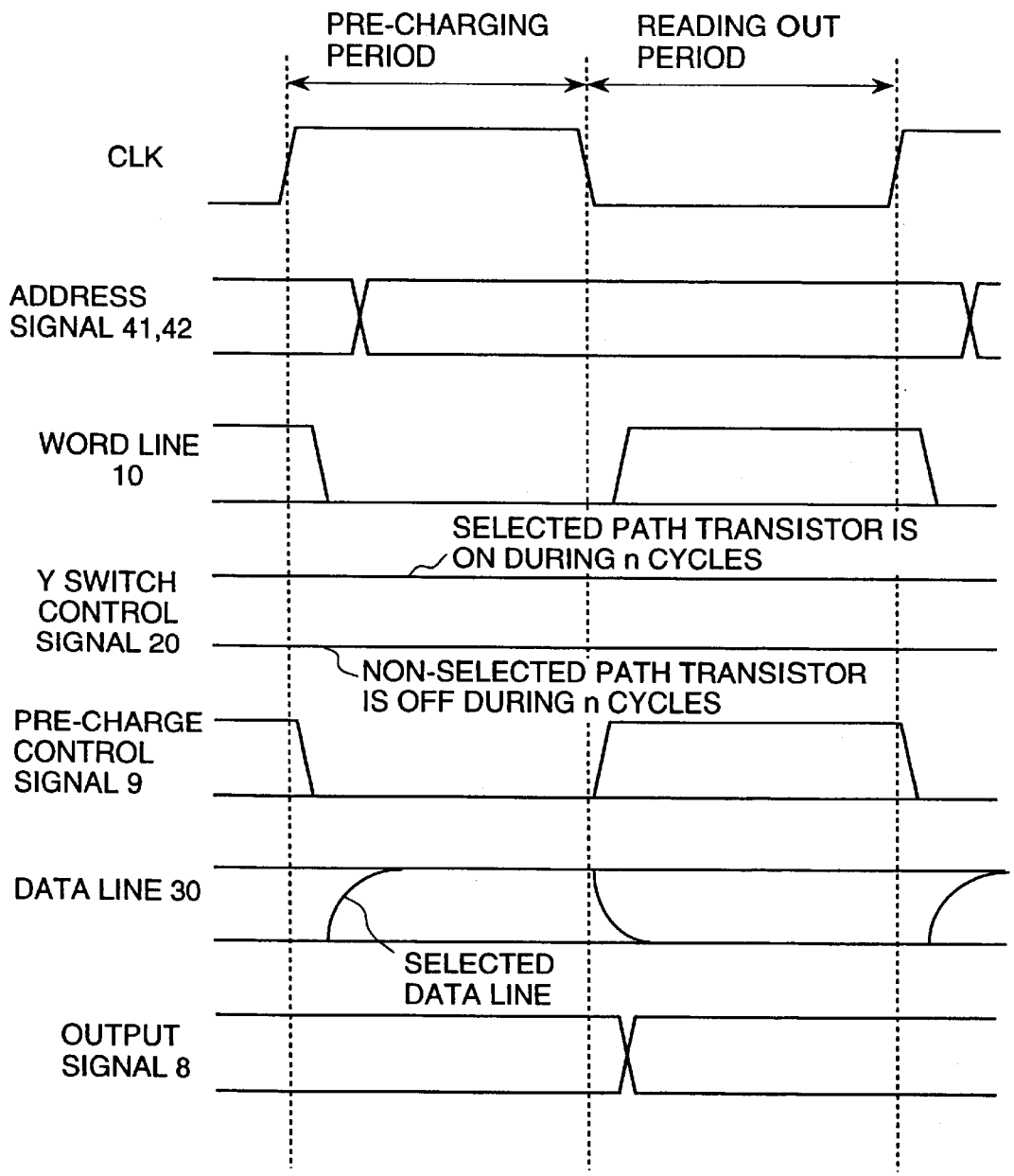
FIG. 2 is a timing chart for explaining the circuit operation of the first embodiment of the present invention.

In accordance with the present invention, pre-charging the data line at the non-selected address can be eliminated, and the consuming current can be decreased in comparison with the prior art, such as JP-A-6-119793 (1994). This is explained hereinafter referring to the timing table of FIG. 2 indicating potential variation in respective signal lines of the ROM 100.

When the clock (CLK) changes from the low level (L) to the high level (H), that is a rise of the clock, an address datum to be selected in the cycle is set in the program counter 200; the lower level bit signal 41 of the address is input to the X decoder 1, and the higher level it signal 42 is input to the Y decoder 2; and decoding s started. The decoding of the address is completed during the clock is H, and a line out of m Y switch control signals 20 is selected to be H.

In accordance with the rise of the clock, the pre-charge control signal 9 becomes L, and the transistor for pre-charging 90 is turned on. Then, the selected data line 30 is pre-charged to the power source voltage $V_{DD}$, that is H. During the clock is H, X decoder 1 is input with a signal reverse to the clock, that is L. Accordingly, any of the word line 10 does not become H, and the electric charge pre-charged to the data line can not be withdrawn.

At this time, when the same address of the data line as the address in the previous cycle is selected, the output from the Y decoder does not change at all, and the consuming current can be saved because pre-charging to the non-selected data lines can be eliminated.

Next, when the clock becomes L, a line out of n word lines 10 is selected, and becomes H. At this time, when a memory cell wherein the N channel transistor is formed is selected, the electric charge of the data line is withdrawn and the data line becomes L, and the output signal 8 is output via the output circuit 7. On the other hand, when a memory cell wherein the N channel transistor is not formed is selected, the electric charge of the data line is not withdrawn and the data line remains H, and the output signal 8 is output via the output circuit 7.

As explained above, the data "1" or "2" is programmed in the respective of the memory cells 50 in the memory cell array 5 depending on the presence or non-presence of the N channel transistor during manufacturing.

Figure 3:
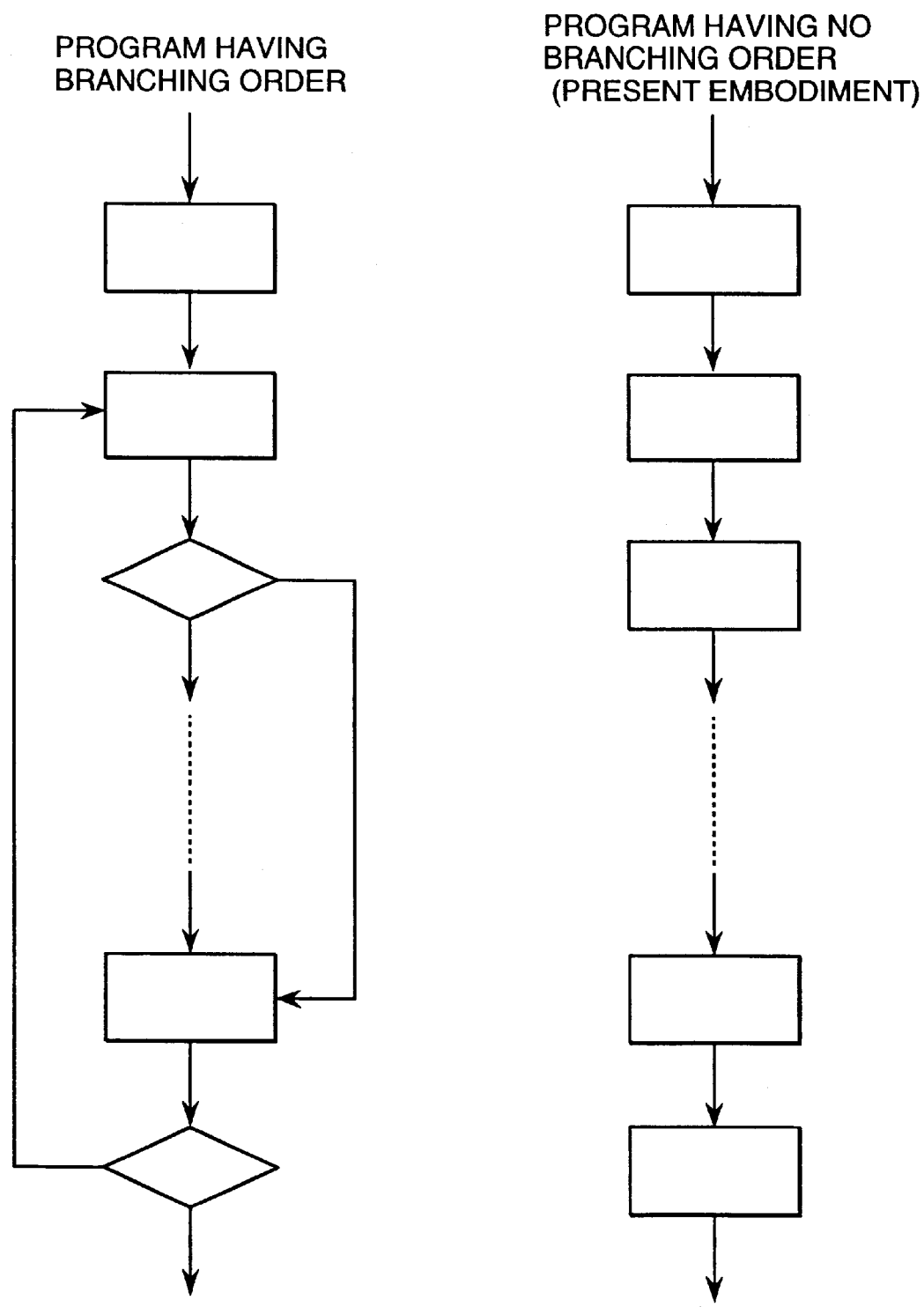
FIG. 3 is an illustration for explaining the program having no branching order.

As explained above, the circuit system of the present invention utilizes a feature that the program has localization in general. However, further lower consuming current can be realized by preparing the program so as to eliminate branching order and to execute the order sequentially as indicated in FIG. 3. In this case, the output from the Y decoder is kept constant during n cycles, because the program counter is always added one by one as indicated in the timing chart of FIG. 2. Therefore, during the n cycles, only the selected data line 30-1 is pre-charged, and pre-charging other data lines (30-2~30-m) can be certainly avoided, because only the path transistor 60-1, for instance, is on, and other transistors (60-2~60-m) are off. If the address is transferred to the adjacent data line 30-2 at n+1 cycle, the output of the Y decoder is varied, and it is possible to pre-charge the previously selected data line 30-1 again as described previously. However, n is sufficiently larger than 1 in general, and the frequency to cause the above pre-charging is extremely small.

In accordance with applying the system of the present invention to the ROM storing the program such as above, the consuming current at pre-charging time can be decreased to 1/m (m is the number of the data lines) in comparison with the conventional pre-charging system wherein all the data lines are pre-charged. Furthermore, the consuming current of the Y decoder can be decreased to 1/n (n is the number of the word lines) in comparison with the circuit system disclosed in JP-A-6-119793 (1994). The decrease in consuming current explained above can be realized with not increasing consuming current to portions other than the pre-charging circuit, or they decoder, nor increasing circuit area of the whole memory.

The program having no branching order has a feature that runaway caused by, for instance, entering into an infinite loop can be avoided. Therefore, any reset circuit becomes unnecessary, and the size of microcomputer itself can be decreased. The program having no branching order such as above can be utilized as the programs for microcomputers, which are mounted in apparatus requiring a high reliability, a small size, and a small consuming current, for instance, medical apparatus such as micro-robot for performing medical treatment of affected parts by entering into the human body, and others. In a case when such utilization is realized, the ROM of the present invention is most adequate for storing such a program.

Figure 4:
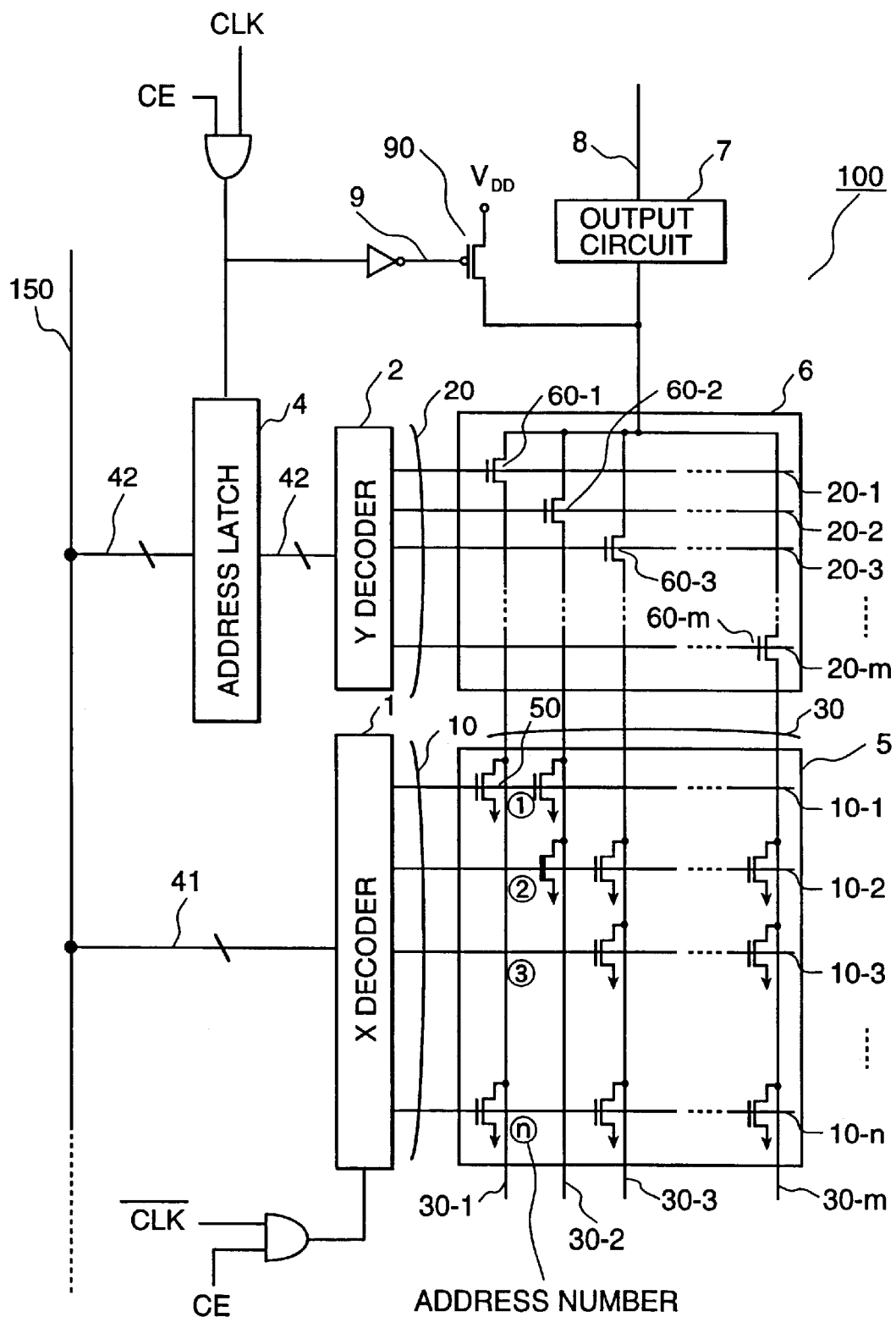
FIG. 4 is a schematic illustration for explaining the second embodiment of the present invention.

The second embodiment of the semiconductor memory device of the present invention is indicated in FIG. 4. The present embodiment relates to a semiconductor memory device, wherein address signals are input from an address bus common to various hard modules such as memory, resister and so on, and lower level bit signals of the address are input into the X decoder and higher level bit signals of the address are input into the Y decoder.

The embodiment indicated in FIG. 4 is described particularly on a ROM, but if flip-flop is used for memory cell, it can be applied to a RAM. The present embodiment is composed of same circuits with the ROM of the first embodiment indicated in FIG. 1, except inputting the address signals 41 or 42 from the address bus 150 into the ROM 100. The constitution, wherein the execution address of all the hard module including the ROM are designated by an address bus, is generally adopted in conventional microcomputers.

The present embodiment is also composed so that the lower level bit signals 41 of the address are input into the X decoder, and the higher level bit signals 42 of the address are input into the Y decoder. The circuit operation is as same as the circuit operation explained in the first embodiment of the present invention, except using a logical product of clock signal with CE (chip enable) signal, in order to operate the ROM during only the period when the address of the ROM is selected. For instance, When the ROM is selected, the CE signal becomes H, and the CE signal becomes L during the period when the ROM is not selected and all the operation of the ROM is ceased.

Feature of the present embodiment is in providing the address latch 4 for maintaining the higher level bit signals of the address transmitted from the address bus 150 at the previous stage of the Y decoder 2. The address latch 4 maintains the higher level bit signals of the address of the ROM, which has been selected finally, even during the ROM is not selected, and keeps the on condition of, for instance, path transistor 60-1 selected at that time. Therefore, subsequently a ROM is selected, if the same data line 30-1 as the data line (for instance 30-1) selected previously is selected, pre-charging the non-selected data lines can be avoided, because the output from the Y decoder has been fixed. As described previously, the address of ROM or RAM has a high frequency of successive access, for instance, such as ①→②→③. . . . Therefore, consuming current of the ROM or RAM, which receives address signals from the address bus, can be decreased by adopting the circuit constitution of the present invention.

In a case when the address latch 4 is not provided at the prior stage to the Y decoder 2, the Y decoder is connected directly to the address bus 150, and input signals to the Y decoder is varied depending on the signal to select the address of other hard modules during the ROM is not selected. Similarly, in a case when the address latch 4 is not provided at the prior stage to the Y decoder, even if the circuits are composed to input a logical product of address signal 42 and the CE into the Y decoder so as not to vary the input signal to the Y decoder, all the input signals to the Y decoder are fixed to L during the period when the ROM is not selected. In any cases, when the ROM is selected next, problems are caused such as; a period for fixing the output of the Y decoder is prolonged; data lines of the address, which is not selected in the cycle, are pre-charged during the non-fixed period; and the consuming current is increased.

Figure 5:
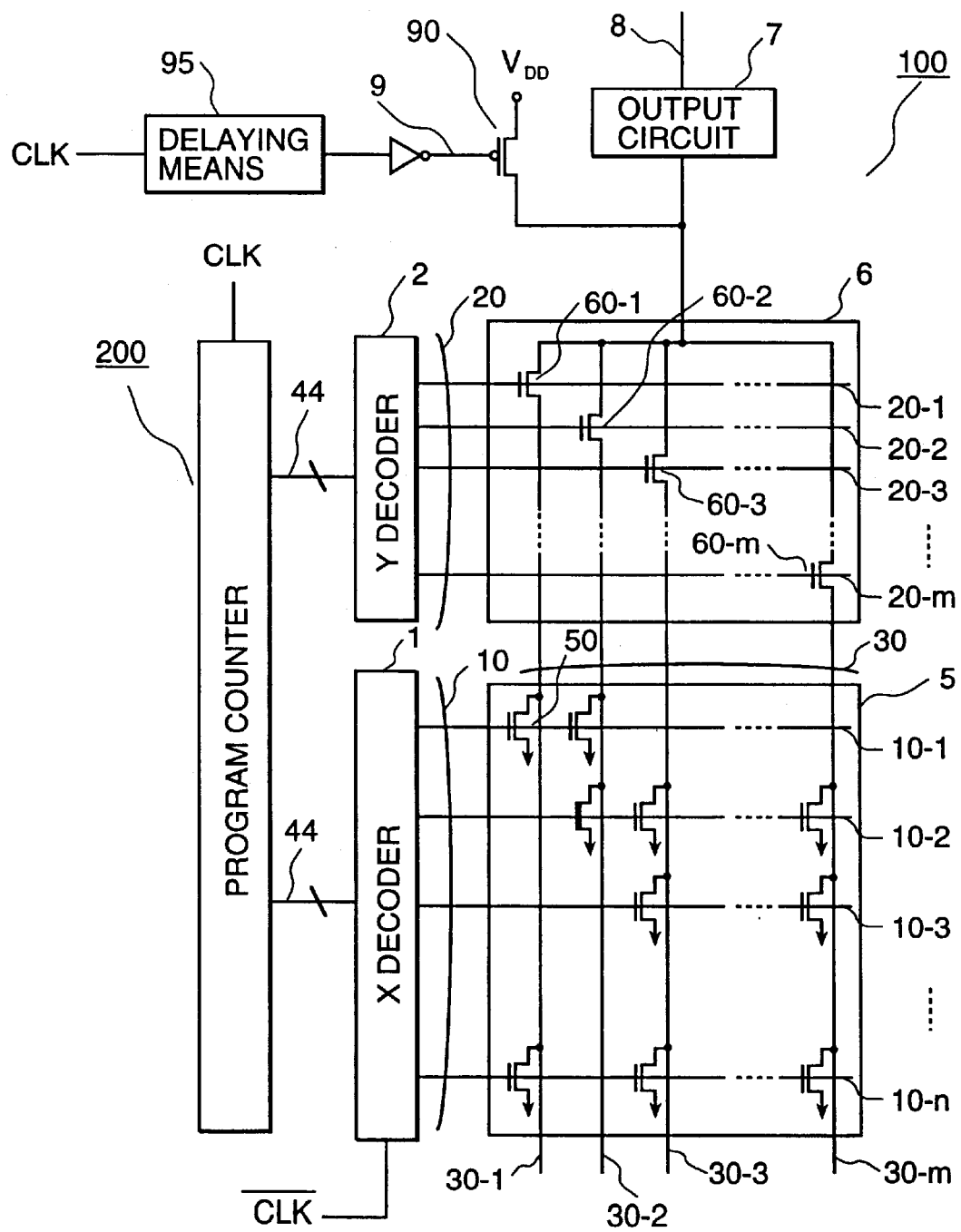
FIG. 5 is a schematic illustration for explaining the third embodiment of the present invention.

The third embodiment relating to the semiconductor memory device of the present invention is indicated in FIG. 5. The present embodiment relates to a semiconductor memory device provided with delay means, wherein address signals are input from a program counter which transmits the address signals only to the semiconductor memory device. The embodiment indicated in FIG. 5 is described particularly on a ROM, but if flip-flop is used for memory cell, it can be applied to a RAM. Hereinafter, the ROM of pre-charging system is explained, and its memory portion is composed of a memory of capacity n X m bits, that is, a matrix of n rows by m columns of n word lines and m data lines.

The ROM 100 indicated in FIG. 5 is connected to the program counter 200, which transmits address signals to only the ROM 100, and the ROM comprises memory cell array 5 for storing data; X decoder 1, which selects a word line from n word lines 10 in the memory cell array corresponding to an address signal 44 transmitted from the program counter 200 to the ROM 100; transistors 90 for pre-charging to pre-charge the data lines 30; output circuit 7 for reading out the data in the data lines; Y switch 6 composed of m bus-transistors 60 for connecting the output circuit and the data lines; Y decoder 2, which selects a line from m Y switch control signal lines 20 corresponding to an address signal 44 transmitted from the program counter 200 to the ROM 100, and a delaying means 95.

Different from conventional microcomputer, the ROM is composed so that the program counter transmits the address signal only to the ROM. Its advantage is as same as described on the first embodiment.

In accordance with the present embodiment, the drain of the transistor 90 for pre-charging is connected to the data line 30 in the memory cell array via the Y switch 6. Therefore, only the path transistor selected by the Y decoder 2 is made on, and only the data line at the selected is pre-charged. Accordingly, in comparison with prior art wherein all the data lines are pre-charged, the consuming current at pre-charging can be decreased significantly, as described previously in the first embodiment.

Feature of the present embodiment is in providing a delaying means 95 to delay arrival of the clock signals at pre-charging control signal line 9. In accordance with the present embodiment, no particular restriction is necessary in a manner to input the address signals into the decoder. Hereinafter, circuit operation of the present embodiment and advantages of decreasing the consuming current are explained referring to a timing chart of FIG. 6.

At a time when the clock varied from L to H, that is, when rising up of the clock, the address data to be selected at the cycle are set at the program counter 200, and decoding is started by inputting the address signals 44 into the X decoder 1 and the Y decoder 2. The decoding of the address is completed during the period when the clock is in H, and a line out of m Y switch control signals 20 is selected and becomes H. Similarly, in accordance with rising up of the clock, pre-charge control signals 9 become L, and the transistor 90 for pre-charging becomes on. Accordingly, the selected data line 30 is pre-charged to the power source voltage $V_{DD}$, that is, to H.

Figure 6:
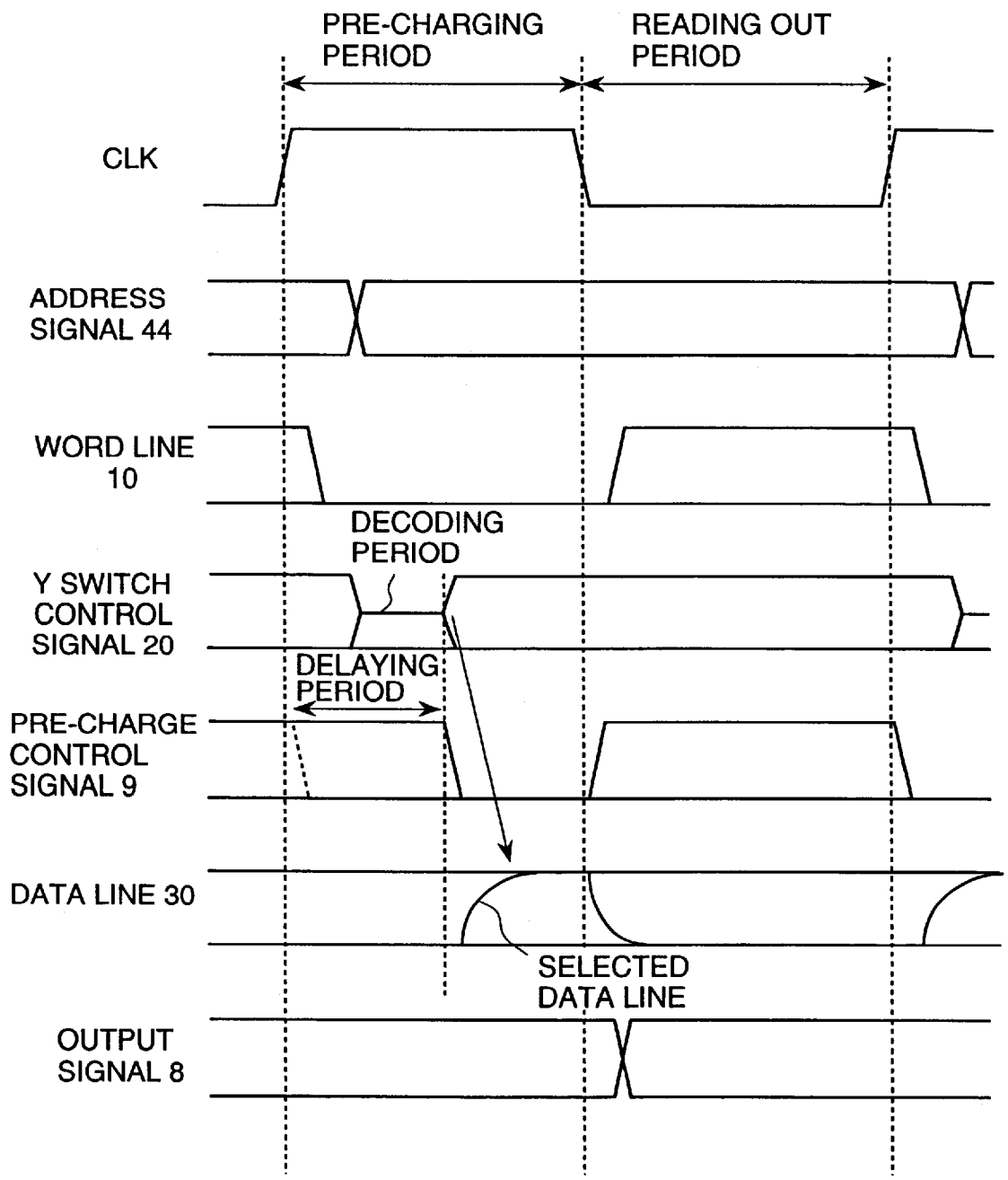
FIG. 6 is a timing chart for explaining the circuit operation of the third embodiment of the present invention.

Reading out operation during the period when the clock is L is as same as described previously in the first embodiment of the present invention, In accordance with the present embodiment, the delaying means 95 is provided in order to perform two operations such as decoding and pre-charging sequentially in the order described above during the period when the clock is H. That is, as indicated in FIG. 6, the pre-charge is started by making the transistor 90 for pre-charging on after the Y switch control signal 20 is fixed completely and only the path transistor connected to the data line at the selected address is made on. In accordance with the constitution described above, only the selected data line is pre-charged certainly, and it becomes possible to decrease the consuming current at pre-charging. Even in the cases if the address is not accessed continuously, or even if the address is accessed continuously, the selected data line differs from the data line selected in the prior cycle by arranging the address of the memory cell in a direction along the word lines such as the circuit constitution disclosed in JP-A-6119793 (1994), pre-charging again the data line selected in the prior cycle can be avoided, and the consuming current can be decreased by performing the pre-charge after fixing the output of the Y decoder.

Furthermore, the present embodiment has the following advantages. In general, all through the operation time, the consuming current of whole chip becomes maximum at the moment of rising-up the clock, because logics, resistors, and the like in addition to the memory are started their operation simultaneously. The power source line is provided with various resistances including parasitic resistance. However, at the moment of rising-up the clock, a voltage drop is generated by the resistances in proportion to the value of peak current, and the power voltage in the chip becomes lower in comparison with the power voltage supplied from outside to the chip. Decreasing the power voltage causes decreasing operation velocity of the circuit, and yields a possibility to cause malfunction. Therefore, the peak current must be decreased as much as possible. In accordance with the present invention, pre-charging can be delayed from the rising up of the clock. Accordingly, the consuming current of all the chips at rising up the clock can be decreased as much as required for pre-charging. Therefore, decrease in operation velocity by voltage drop of other hard modules can be moderated.

In accordance with the present embodiment, as the delaying means 95 for preventing the pre-charging control signal 9 from varying itself over the period of decoding the address, for instance, an inverter, or a circuit connecting multi-stages of gates such as NAND, NOR can be used.

Figure 7:
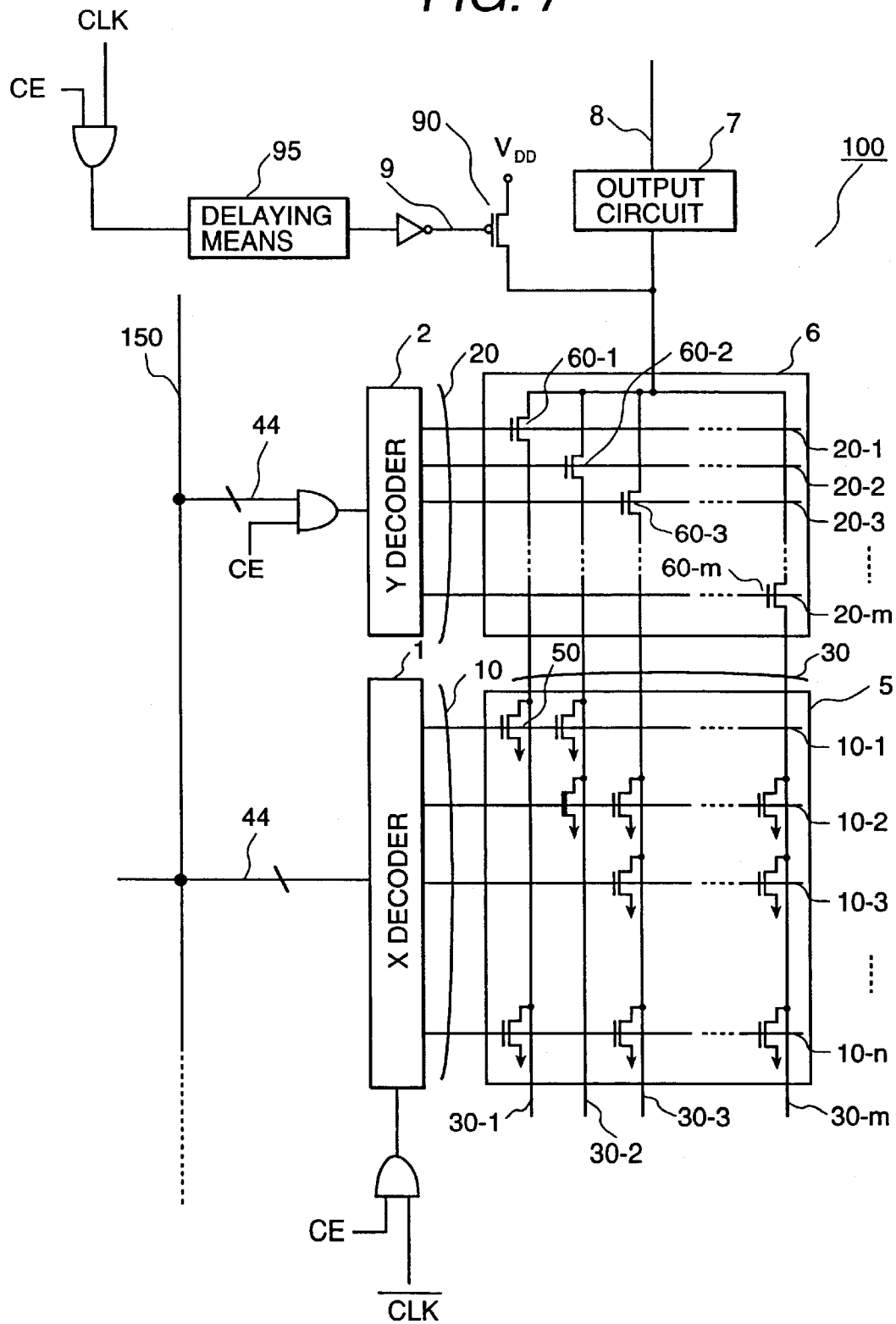
FIG. 7 is a schematic illustration for explaining the fourth embodiment of the present invention.

FIG. 7 indicates the fourth embodiment relating to the semiconductor memory device of the present invention. The present embodiment relates to the semiconductor memory device provided with a delaying means, wherein address signals are input from address bus common to various hard modules such as memory, resister, and others.

The embodiment shown in FIG. 7 is indicated on a ROM in particular, but it can be applied to a RAM if flip-flop is used for the memory cell. Feature of the circuit constitution and its advantages are as same as the third embodiment of the present invention, except only one point that the address signals 44 are input to the ROM 100 from the address bus 150.

The present embodiment is provided with the delaying means 95, therefore, it is not necessary to maintain the address signals by adding an address latch at prior stage of the Y decoder as the second embodiment (FIG. 4) of the present invention. Because even if the decoding the address is started after selecting the ROM, pre-charging can be performed after completing the operation of the decoding. The present embodiment is provided with a gate which can take logical product of address signals with CE signals, which are input into the Y decoder, instead of an address latch, in order that the Y decoder does not waste useless current when the ROM is not selected.

In all through the above embodiments from 1 to 4, non-overlap two phase clocks can be used for the clock signals. If the two phase clock is used, an erroneous operation by clock's cue can be avoided.

Figure 8:
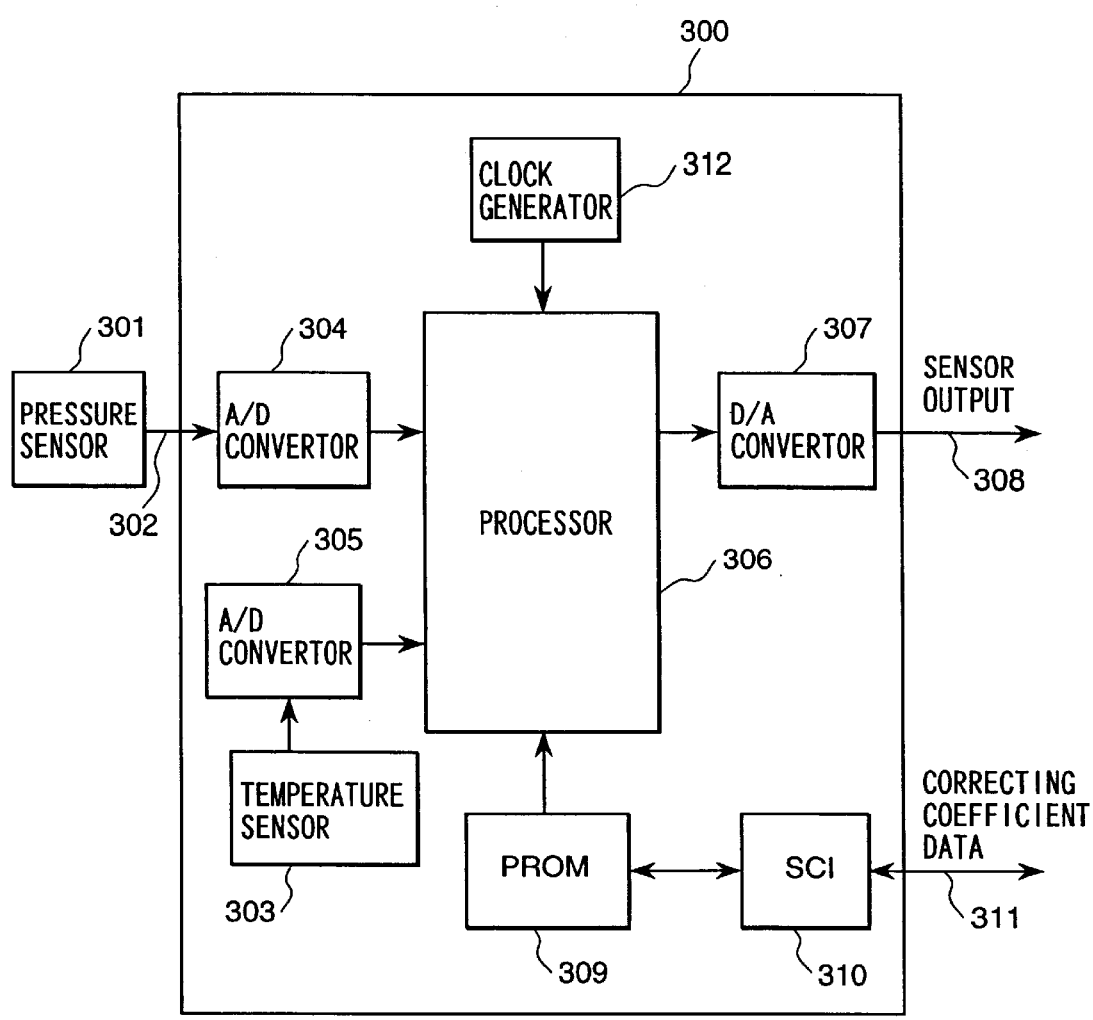
FIG. 8 is a schematic illustration for explaining the fifth embodiment of the present invention.

The fifth embodiment of the present invention is indicated in FIG. 8. The present embodiment is an example, wherein one of the semiconductor memory devices of low consuming current described in the previous embodiments from 1 to 4 is applied to a sensor, in particular a pressure sensor, as a part of correcting means. In general, output characteristics of a sensor varies by respective of sensors, and even if a same sensor, it varies itself depending on temperature. Therefore, a correcting means for correcting characteristics such as zero point, sensitivity, temperature, and others to desired output characteristics becomes necessary.

Operation of the correcting means 300 of the pressure sensor of the embodiment indicated in FIG. 8 is explained hereinafter. An analogous output signal 302 before correction from the pressure sensor 301 is input into the correcting means 300. The signal 302 is converted to a digital signal by the A/D converter 304. An analogous output signal from the temperature sensor 303 included in the correcting means 300 is converted to a digital signal by the A/D converter 305. The both digital signals are input into the processor 306. The processor 306 performs correcting calculation by reading out correcting coefficient data 311 from the PROM (programmable ROM) 309. The data after correcting calculation are converted to analogous signals by the D/A converter 307, and are output as sensor output 308 after correcting characteristics. The correcting coefficient data 311 are written externally into the PROM 309 via the serial communication interface (SCI) 310 after inspecting the characteristics of the pressure sensor 301. The correcting means is incorporated with a clock generator 312, and clock signals are supplied to the processor 306.

Figure 9:
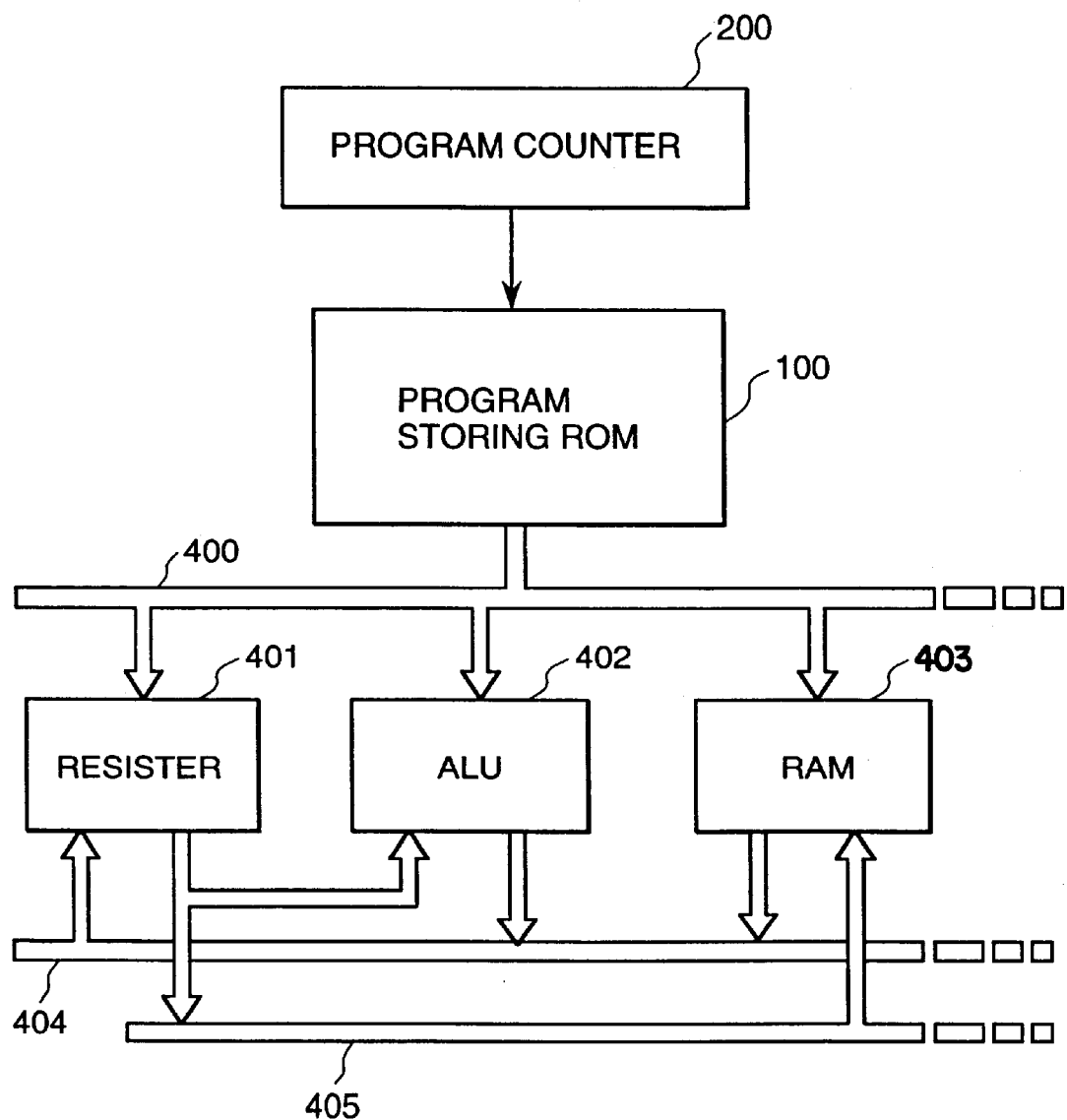
FIG. 9 is a schematic illustration for explaining the composition of the processor in the fifth embodiment of the present invention.
Figure 10:
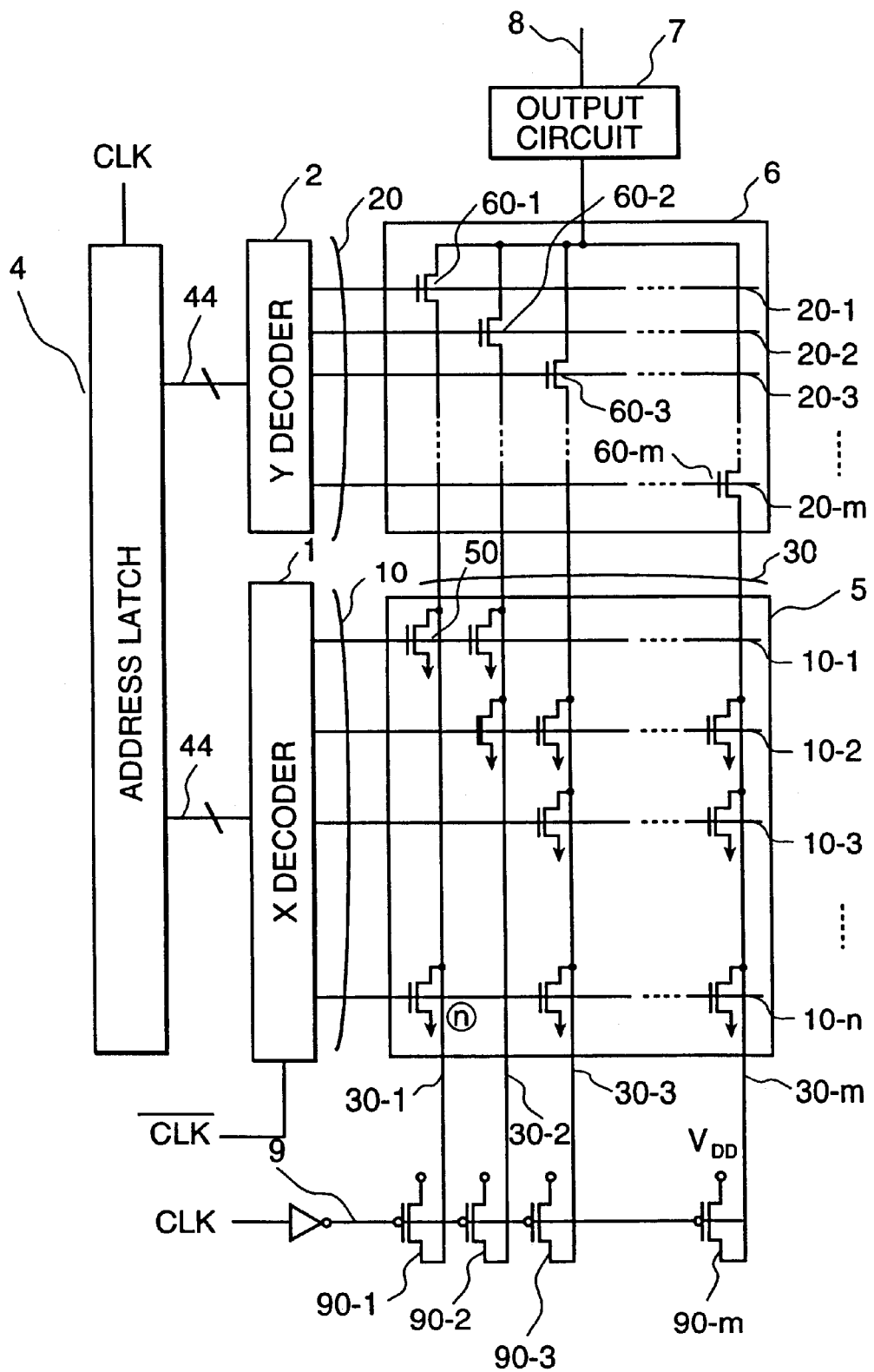
FIG. 10 is an illustration for explaining the prior art.

In accordance with the above correcting means 300, the memory such as ROM, or RAM are incorporated with the processor 306. The constitution of the processor 306 is indicated in FIG. 9. Calculation programs such as correcting calculation and others are stored in a program storing ROM 100. The program counter 200 designates the address of the program storing ROM 100 corresponding to the order to be executed. The present embodiment is composed so that the program does not have branching order, the program counter is always added one by one per every clock, and the address of the ROM is designated continuously. Therefore, low consuming current of the correcting means 300 of the sensor output can be realized by applying the ROM described in the first embodiment of the present invention to the present embodiment.

The data at the designated address in the ROM is transferred to the order code bus 400, and the program is executed. For instance, the highest level bit of the ROM data is an order code, and the addresses of the devices to be operated in the cycle such as resister 401, calculation unit (ALU) 402, RAM 403, and others are designated with residual bits. In accordance with the above order code, for instance, if it is 1, an operation (reading out) to transfer the data from the device designated by the executing address to the resister 401 via the first data bus 404 is designated. If it is 0, an operation (writing in) to transfer the data from the resister 401 to the device designated by the executing address via the second data bus 405 is designated. As explained above, correcting calculation is executed in accordance with programs by interchanging data among respective devices via two data buses. In accordance with the above constitution, the low consuming current correcting means 300 of the sensor output can be realized by using the RAM described in the second embodiment or in the fourth embodiment of the present invention as the RAM 403.

The present invention has been considered by utilizing a fact that the address of semiconductor memory device is frequently accessed successively. The semiconductor memory device comprising: plural memory cells for storing information; plural word lines and data lines; an output circuit for outputting stored data; a first decoder selecting one of the word lines corresponding to address signal; plural path transistors for connecting the data lines with the output circuit; a second decoder for selecting one of the path transistors corresponding to address signal and switching the chosen path transistor on; and transistor for pre-charging the data lines prior to read out the data; wherein lower level bit signals of the address are input into the first decoder; upper level bit signals of the address are input into the second decoder; and addresses of the memory cells array are arranged sequentially in a direction of data lines. Accordingly, only the data line of selected address can be pre-charged, and the consuming current at the pre-charging can be decreased in comparison with prior art.

Particularly, in accordance with applying the system of the present invention to the ROM, which stores a program having no branching order, and executing orders sequentially, the consuming current at pre-charging time can be decreased to 1/m (m is the number of the data lines) in comparison with the conventional pre-charging system wherein all the data lines are pre-charged. Furthermore, the consuming current of the Y decoder can be decreased to 1/n (n is the number of the word lines) in comparison with the circuit system disclosed in JP-A-6-119793 (1994). The decrease in consuming current explained above can be realized with not increasing consuming current to portions other than the pre-charging circuit, or the Y decoder, nor increasing circuit area of the whole memory.

In accordance with the present invention, a pre-charge control signal line is provided with a delaying means for delaying arrival of the clock signals in order to pre-charge after completing the decoding the address. Accordingly, even if the address is not accessed continuously, the pre-charging can be performed certainly only on the data line at the selected address, and the consuming current can be decreased. In accordance with the present constitution, pre-charging can be delayed from the rising up of the clock. Accordingly, the consuming current of all the chips at rising up the clock can be decreased as much as required for pre-charging. Therefore, decrease in operation velocity by voltage drop of other hard modules can be moderated.

Low consuming current sensors can be realized by applying the low consuming current semiconductor memory device as explained above to the characteristics correcting means of the sensors.

What is claimed is:

1. A semiconductor memory device comprising:

plural memory cells for storing information;

plural word lines and data lines;

an output circuit for outputting stored data;

a first decoder for selecting one of said word lines corresponding to an address signal;

plural path transistors for connecting said data lines with said output circuit;

a second decoder for selecting one of said path transistors corresponding to the address signal and switching said selected path transistor on; and a transistor for pre-charging said data lines prior to read out data; wherein lower level bit signals of address are input into said first decoder, and upper level bit signals of address are input into said second decoder.

2. A semiconductor memory device comprising:

plural memory cells for storing information;

plural word lines and data lines;

an output circuit for outputting stored data;

a first decoder for selecting one of said word lines corresponding to an address signal;

plural path transistors for connecting said data lines with said output circuit;

a second decoder for selecting one of said path transistors corresponding to the address signal and switching said selected path transistor on; and a transistor for pre-charging said data lines prior to read out data; wherein addresses to be accessed vary continuously; further wherein;

lower level bit signals of address are input into said first decoder, and upper level bit signals of address are input into said second decoder.

3. A semiconductor memory device comprising:

plural memory cells for storing information;

plural word lines and data lines;

an output circuit for outputting stored data;

a first decoder for selecting one of said word lines corresponding to an address signal;

plural path transistors for connecting said data lines with said output circuit;

a second decoder for selecting one of said path transistors corresponding to the address signal and switching said selected path transistor on; and a transistor for pre-charging said data lines prior to read out data; further comprises;

a delaying means for delaying timing to switch said transistor for pre-charging on.

4. A semiconductor memory device as claimed in, claim 1 wherein drain of said transistor for pre-charging is connected to said data line via said path transistor.

5. A sensor comprising a correcting means for correcting characteristics; wherein said correcting means comprises a semiconductor memory device as claimed in claim 1.

* * * * *